(12) United States Patent
Linder et al.

(10) Patent No.: US 10,249,785 B2
(45) Date of Patent: *Apr. 2, 2019

(54) REDUCING DARK CURRENT IN GERMANIUM PHOTODIODES BY ELECTRICAL OVER-STRESS

(71) Applicant: INTERNATIONAL BUSINESS MACHINES CORPORATION, Armonk, NY (US)

(72) Inventors: Barry P. Linder, Hastings-on-Hudson, NY (US); Jason S. Orcutt, Katonah, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/689,556

(22) Filed: Aug. 29, 2017

(65) Prior Publication Data
US 2017/0365735 A1 Dec. 21, 2017

Related U.S. Application Data

(63) Continuation of application No. 15/010,910, filed on Jan. 29, 2016, now Pat. No. 9,755,100.

(51) Int. Cl.
| | | |
|---|---|---|
| *H01L 31/18* | (2006.01) | |
| *H01L 21/66* | (2006.01) | |
| *H01L 31/024* | (2014.01) | |
| *H01L 31/028* | (2006.01) | |
| *G01R 19/00* | (2006.01) | |
| *H01L 31/0203* | (2014.01) | |
| *H01L 31/105* | (2006.01) | |

(52) U.S. Cl.
CPC ...... *H01L 31/1864* (2013.01); *G01R 19/0092* (2013.01); *H01L 22/20* (2013.01); *H01L 22/26* (2013.01); *H01L 31/0203* (2013.01); *H01L 31/024* (2013.01); *H01L 31/028* (2013.01); *H01L 31/105* (2013.01); *H01L 31/186* (2013.01); *H01L 31/1808* (2013.01); *H05K 999/00* (2013.01)

(58) Field of Classification Search
None
See application file for complete search history.

(56) References Cited

U.S. PATENT DOCUMENTS

| 6,072,201 A | 6/2000 | Fang et al. |
|---|---|---|
| 7,700,975 B2 | 4/2010 | Rakshit et al. |
| (Continued) | | |

FOREIGN PATENT DOCUMENTS

| JP | 55-091184 | 10/1980 |
|---|---|---|
| JP | 60-057685 | 8/1983 |

OTHER PUBLICATIONS

List of IBM Patents or Patent Applications Treated as Related dated Aug. 29, 2017, 2 pages.

(Continued)

*Primary Examiner* — Asok K Sarkar
(74) *Attorney, Agent, or Firm* — Tutunjian & Bitetto, P.C.; Vazken Alexanian

(57) ABSTRACT

Methods and systems for reducing dark current in a photodiode include heating a photodiode above room temperature. A reverse bias voltage is applied to the heated photodiode to reduce a dark current generated by the photodiode.

12 Claims, 5 Drawing Sheets

(56) References Cited

U.S. PATENT DOCUMENTS

| | | |
|---|---|---|
| 8,415,189 B2 | 4/2013 | Kwon et al. |
| 8,614,116 B2 | 12/2013 | Assefa et al. |
| 9,711,550 B2 | 7/2017 | Favennec et al. |
| 9,755,100 B2 * | 9/2017 | Linder ................ H01L 31/1864 |
| 9,853,179 B2 * | 12/2017 | Linder ................ H01L 31/1864 |
| 2005/0184321 A1 | 8/2005 | Luo |
| 2007/0131977 A1 | 6/2007 | Boisvert et al. |
| 2015/0028386 A1 | 1/2015 | Shi et al. |

OTHER PUBLICATIONS

Lischke, S. et al. Low Dark Current Ge PIN Photodiode for a High-Performance, Photonic BiCMOS Process for Radio-over-Fiber Applications, in Photonics Conference (IPC), 2012 IEEE, pp. 628-629, Sep. 23-27, 2012.

* cited by examiner

REDUCING DARK CURRENT IN GERMANIUM PHOTODIODES BY ELECTRICAL OVER-STRESS

BACKGROUND

Technical Field

The present invention relates to semiconductor devices and, more particularly, to reducing dark current in germanium photodiodes.

Description of the Related Art

A photodiode is a semiconductor device that converts incoming light into an electrical current. As the photodiode absorbs incoming photons, the energy is converted to electrical energy that can be used for signaling or power generation. Semiconductor-based photodiodes are used in a variety of applications, including, for example, optical switching in photonic circuits, receiving signals in fiber optic communication systems, etc.

The material used to fabricate the photodiode dictates its properties and, in particular, the region of the electromagnetic spectrum to which the photodiodes sensitive. Photodiodes can, for example, be fabricated by depositing germanium diodes on a silicon substrate, providing sensitivity to longer wavelengths than would be accessible to silicon photodiodes. However, the resulting germanium-on-silicon diodes exhibit a high "dark current," which is the current generated by the device when the device is not illuminated. In some cases, the dark current can be in excess of hundreds of nanoamps. Dark current may result from background radiation and the saturation current of the semiconductor junction forming the diode. One possible cause of the high dark current is a high defect density that results from the large lattice constant difference between the silicon and germanium layers. The shot noise from the high dark current reduces the signal-to-noise ratio of the photodetector, making it more difficult to capture faint signals. The variable nature of the dark current over temperature and between devices prevents accurate monitoring of the received optical signal level.

SUMMARY

A method for reducing dark current in a photodiode includes heating a photodiode above room temperature. A reverse bias voltage is applied to the heated photodiode to reduce a dark current generated by the photodiode.

A method for reducing dark current in a photodiode includes heating a germanium photodiode, formed on a silicon substrate, above room temperature. A reverse bias voltage is applied to the heated photodiode to reduce a dark current generated by the photodiode. The dark current generated by the photodiode is measured. The reverse bias voltage is increased until the measured dark current stabilizes to maximize a dark current reduction after the photodiode returns to room temperature.

A system for reducing dark current in a photodiode includes a heater configured to heat a photodiode above room temperature. A reverse bias voltage source is configured to apply a reverse bias voltage to the heated photodiode to reduce a dark current generated by the photodiode.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention reduce dark current in photodiodes by applying a reverse voltage bias and by controlling the temperature of the photodiodes. This has been shown to reduce dark current by up to 30%, substantially decreasing the noise in the photodiode.

Figure 1:
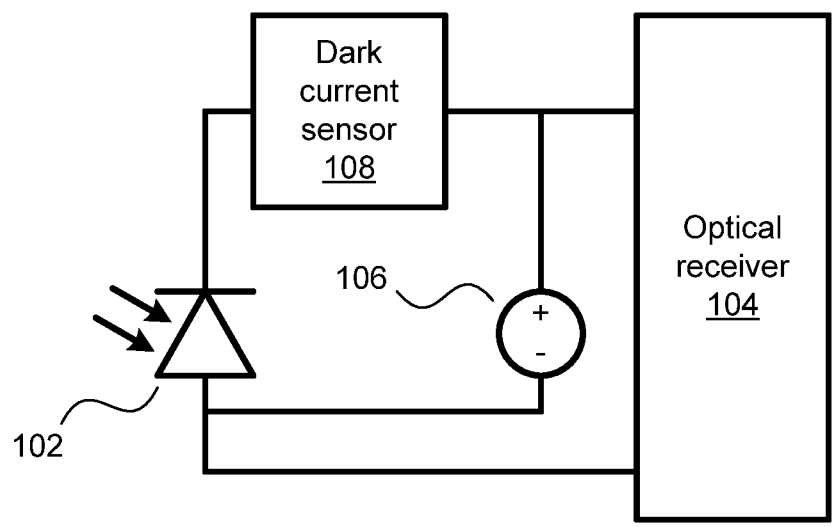
FIG. 1 is a diagram of a system for reducing dark current for a photodiode in accordance with the present principles.

Referring now to the drawings in which like numerals represent the same or similar elements and initially to FIG. 1, an exemplary circuit diagram of the present embodiment is shown. A photodiode 102 is shown feeding into an optical receiver 104. As incident light strikes the photodiode 102, the photodiode 102 produces an electrical current that is detected by the optical receiver 104 and used to, for example, demodulate and decode a communications signal sent over a fiber optic line.

In one particular embodiment, it is contemplated that the photodiode 102 may be formed from germanium deposited on a silicon substrate but, as described below, it should be understood that other materials may be used instead. The photodiode 102 produces some amount of dark current even when the device is not illuminated, raising the noise floor of any received signal.

To address this problem, a voltage source 106 is applied to the photodiode 102 to reverse bias the photodiode 102. When applied at ambient temperatures during operation of the photodiode 102, as shown in FIG. 1, an initial application of a high reverse stress voltage (e.g., about −3.3V for at least a second) results in a reduction in dark current of about 25%. In general, the dark current reduction is maintained until the temperature of the photodiode 102 increases significantly above the temperature at which the reverse stress voltage was applied.

The voltage supplied by voltage source 106 may be a constant voltage or may, alternatively, be a ramp or stepped voltage following any appropriate voltage ramping curve. In some cases, a ramping or stepping voltage stress can reach maximum reduction more quickly and accurately by ramping or stepping the voltage until the dark current reaches a minimum level. In such an embodiment, the dark current may be monitored during application of the reverse bias in a feedback loop using dark current sensor 108. The measurement may then be used to determine the strength of the voltage source 106 as described in detail below.

Figure 2:
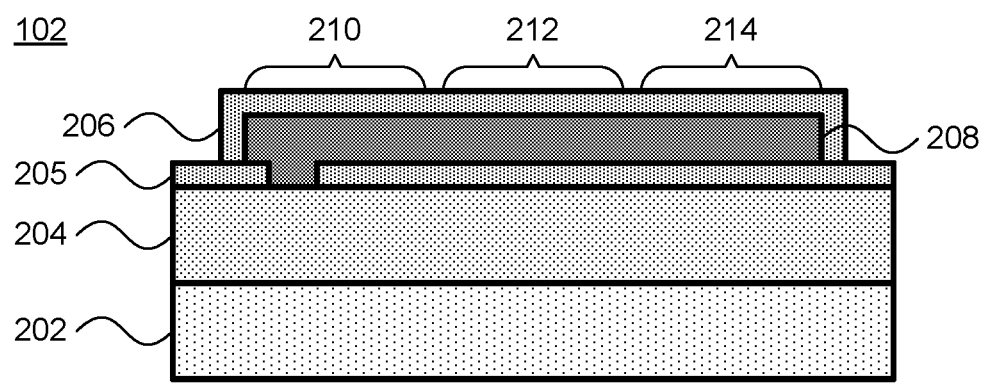
FIG. 2 is a diagram of a photodiode in accordance with the present principles.

Referring now to FIG. 2, detail on the structure of a photodiode 102 is shown. A semiconductor-on-insulator substrate is shown, with a buried insulator layer 202 and a semiconductor layer 204. In another embodiment, a bulk semiconductor substrate may be used instead, omitting the buried insulator layer 202. It should be recognized that any appropriate materials can be used to form the substrate. In one particular embodiment, it is contemplated that the buried insulator layer 202 may be formed from silicon dioxide and that the semiconductor layer 204 may be formed from crystalline silicon. Alternative materials for the semiconductor layer 204 include, for example, silicon germanium, silicon germanium carbide, silicon carbide, polysilicon, amorphous silicon, germanium, gallium arsenide, gallium nitride, cadmium telluride, zinc sellenide, etc. Alternative materials for the insulator layer 202 include, for example, silicon nitrides, sapphire, aluminum nitride, boron nitride, beryllium, nitride, etc.

A nitride layer 205 is formed over the semiconductor layer 204. It is specifically contemplated that the nitride layer 205 may be formed from silicon nitride, but any appropriate insulating material may be used instead. The nitride layer 205 forms an insulating barrier between the semiconductor layer 204 and a diode semiconductor layer 208. In one embodiment, the diode semiconductor layer 208 is formed from a different semiconductor material than the substrate semiconductor layer 204, with germanium being specifically contemplated. The diode semiconductor layer 208 is encapsulated by a nitride layer 206 that may be formed from the same material as the nitride layer 205 (e.g., silicon nitride) or may alternatively be formed from a different insulating material.

The diode semiconductor layer 206 is doped and has three regions—an n-type doped region 210, an intrinsic region 212, and a p-type doped region. Although not shown in this figure, electrical contacts may be form through the encapsulating nitride layer 206 to contact the n-type region 210 and the p-type region 214. Exemplary n-type dopants for a group IV semiconductor include phosphorus, arsenic and antimony. Exemplary p-type dopants for a group IV semiconductor include boron, aluminum, and gallium. The concentration of dopant within the doped region is typically from about 1011 to about 1015 atoms/cm2, with a concentration of dopant within the doped region from about 1011 to about 1013 atoms/cm2 being more typical.

In this particular embodiment, a portion of the diode semiconductor layer 208 comes into contact with the substrate semiconductor layer 204 through a hole in the nitride layer 205. This contact point may be used during formation to establish a crystalline seeding point, such that the diode semiconductor layer 208 may be a single, monocrystalline structure.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., GaInP, InGaAs or SiGe. These compounds include different proportions of the elements within the compound, e.g., InGaAs includes $In_xGa_yAs_{1-x-y}$, where x, y are less than or equal to 1, or SiGe includes $Si_xGe_{1-x}$, where x is less than or equal to 1, etc. In addition, other elements may be included in the compound, such as, e.g., AlInGaAs, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention will be described in terms of a particular tandem (multi-junction) structure; however, other architectures, structures, substrate materials and process features and steps may be varied within the scope of the present invention. The tandem structure includes cells, which will be described in terms of a particular material. Each cell includes a p-doped layer, an n-doped layer and perhaps an undoped intrinsic layer. For the present description, the n-doped layer and p-doped layers will be formed either from a same base material that is doped to provide an n-type portion and a p-type portion or from two different base materials so that a first material is doped to provide the n-type portion and the second material is doped to provide the p-type portion. For simplicity, each cell layer will be described in terms of the base layer material. The n-doped and p-doped regions are preferably formed by doping during epitaxial growth. Other doping methods may also be employed. While intrinsic layers may be formed between the n-type and p-type layers, e.g., very thin intrinsic layers inserted intentionally between an emitter and a base to mitigate intermixing of the dopants at a junction, the intrinsic layers, if needed, are not depicted in the drawings for simplicity.

The present embodiments may be part of a photovoltaic device or circuit, and the circuits as described herein may be part of a design for an integrated circuit chip, a solar cell, a light sensitive device, etc.

It is also to be understood that the present invention will be described in terms of a given illustrative architecture having a particular tandem (multijunction) structure; however, other architectures, structures, substrate materials and process features and steps may be varied within the scope of the present invention. The tandem structure includes cells, which will be described in terms of a particular material. While each cell includes a p-doped layer, an n-doped layer and perhaps an undoped intrinsic layer, the n-doped layer and p-doped layers will be omitted from the FIGS. and the description for ease of explanation. Instead, for simplicity, each cell layer will be described in terms of a base layer material and a band gap associated with the base layer. The n-doped and p-doped regions may be formed by doping during epitaxial growth or doped after formation by any known implantation or diffusion process.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

While the above-described dark current reduction is possible to trigger at runtime, the present embodiments furthermore provide a process to lock-in the dark current reduction. This is accomplished by applying a reverse bias voltage during an anneal. An anneal is commonly used after device fabrication, prior to shipping the device, to test the device for reliability.

Figure 3:
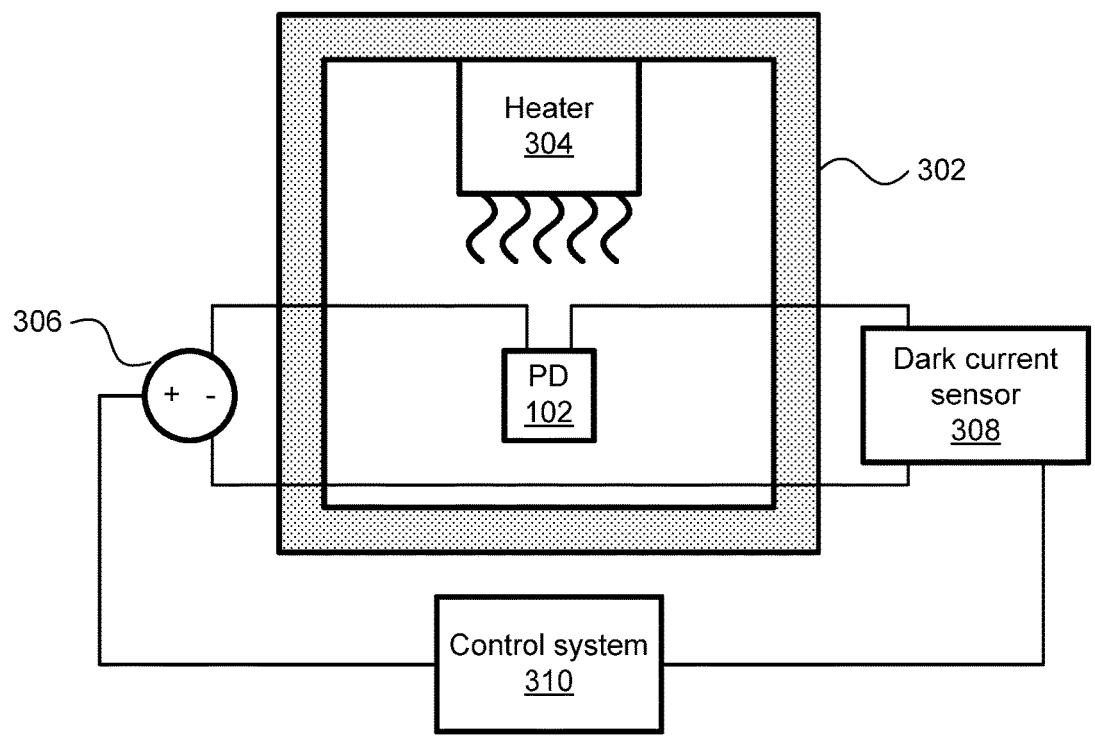
FIG. 3 is a diagram of a system for reducing stable dark current for a photodiode in accordance with the present principles.

Referring now to FIG. 3, a system for permanently reducing the dark current of a photodiode 102 is shown. After fabrication, the photodiode 102 is placed into, e.g., an oven 302 with a heater 304. As noted above, the heater 304 may increase the ambient temperature of the air inside the oven 302 or, alternatively, may apply heat to the photodiode 102 more directly, for example through a heater on the chuck holding the photodiode 102 or through an on-chip heater. The heater 304 increased the temperature to a level at or above an intended maximum operating temperature of the photodiode 102.

During application of heat, for example during a burn-in reliability anneal, a voltage source 306 is connected to the photodiode 102 to apply a reverse bias voltage to the photodiode 102. Applying the reverse bias voltage at a high temperature during the anneal locks the dark current reduction, such that the dark current is permanently reduced as long as the temperature of the photodiode 102 does not increase above the anneal temperature.

The reverse bias voltage source 306 may be a constant voltage or, as described in more detail below, may be ramped to find an optimal reverse bias voltage for dark current reduction. Toward that end, a dark current sensor 308 may be connected to the photodiode 102 to measure the dark current, while a control system 310 determines the effect of different reverse voltage bias values on the dark current and adjusts the output of the reverse bias voltage source 306 accordingly.

Figure 4:
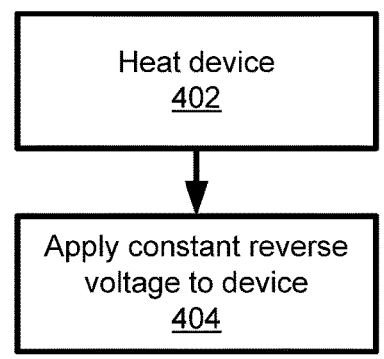
FIG. 4 is a block/flow diagram of a method for reducing stable dark current for a photodiode in accordance with the present principles.

Referring now to FIG. 4, a method for reducing dark current in a photodiode 102 is shown. Block 402 heats the photodiode 102 using heater 304 which may produce, for example, an increase in the ambient temperature, an increase in chunk temperature, or an increase in temperature of an on-chip heater. Block 404 then applies a constant reverse voltage to the photodiode 102 using the voltage source 306.

Heating the photodiode 102, for example during part of the anneal, while applying the reverse bias voltage can result in stable dark current reductions that remain even after the bias is removed. In one test, where a reverse bias of about −2.7V was applied without additional heat (e.g., at room temperature), a reduction of dark current of about 20%-30% was measured as compared to the dark current generated by a device that had no reverse bias voltage applied, but this reduction diminished to 5% after the reverse bias voltage was removed and a subsequent anneal was applied that raised the temperature of the photodiode above room temperature. In a second test, where a reverse bias voltage of about −2.4V was applied for ten hours at 175° C. followed by a fifty hour anneal at 175° C. without a reverse bias, a dark current reduction of about 15%-20% was maintained even after the anneal.

Figure 5:
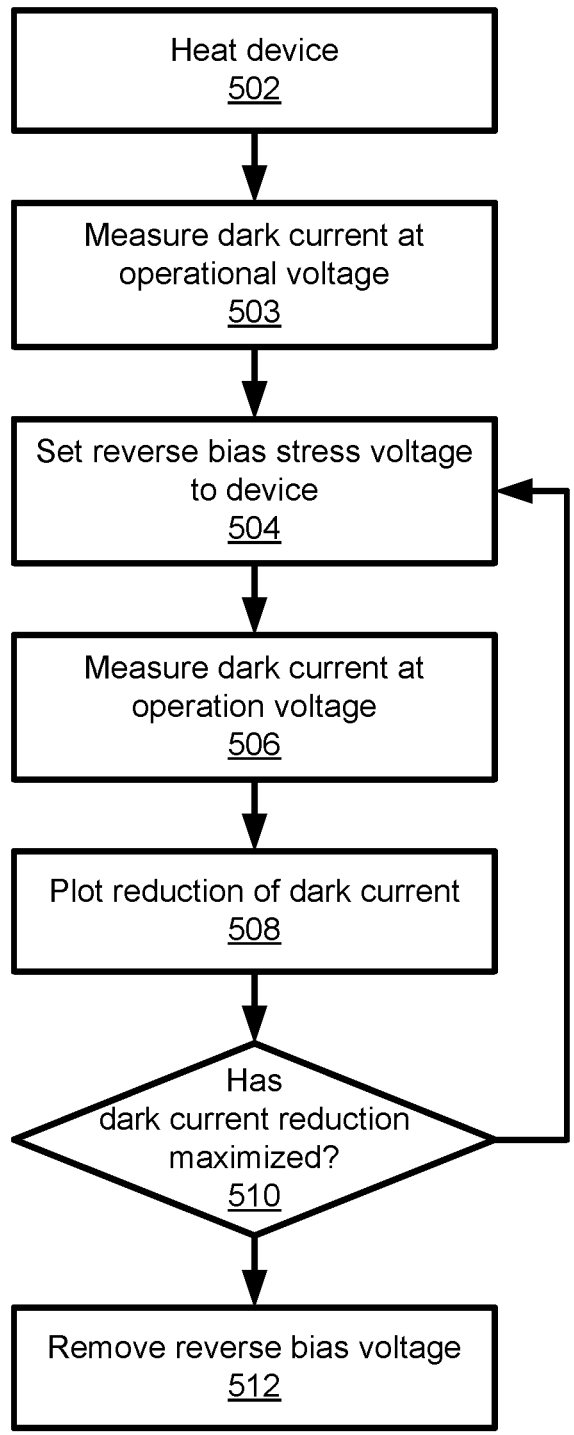
FIG. 5 is a block/flow diagram of a method for reducing stable dark current for a photodiode in accordance with the present principles.

Referring now to FIG. 5, an alternative method for reducing dark current in a photodiode is shown. Block 502 heats the photodiode 102 using the heater 304. Block 503 makes an initial measurement of the dark current at an operational voltage. Block 504 then applies an initial reverse bias voltage to the photodiode 102 using the voltage source 306. Block 506 measures the dark current at the operational voltage using a dark current sensor 308. Block 508 plots the reduction of the dark current as a function of the reverse bias voltage, noting the rate of decrease of the dark current. It should be recognized that any appropriate form of comparison between data points may be used in block 508 as an alternative to plotting the points.

Block 510 determines whether the dark current reduction is at a maximum (e.g., by comparing a set of dark current measurements to determine whether they continue to decrease). If the maximum reduction has not been reached, processing returns to block 506 to increase the reverse bias voltage for the photodiode 102 for another dark current measurement.

If the maximum reduction has been reached, block 512 removes the reverse bias voltage. The anneal may continue after this point, but the dark current reduction will be maintained as long as the temperature of the photodiode 102 does not exceed the temperature during the application of the reverse bias voltage. In one example, with an anneal at 175° C. for sixty hours, the reverse bias voltage may be applied for ten hours to achieve a stable 20% reduction in dark current.

Figure 6:
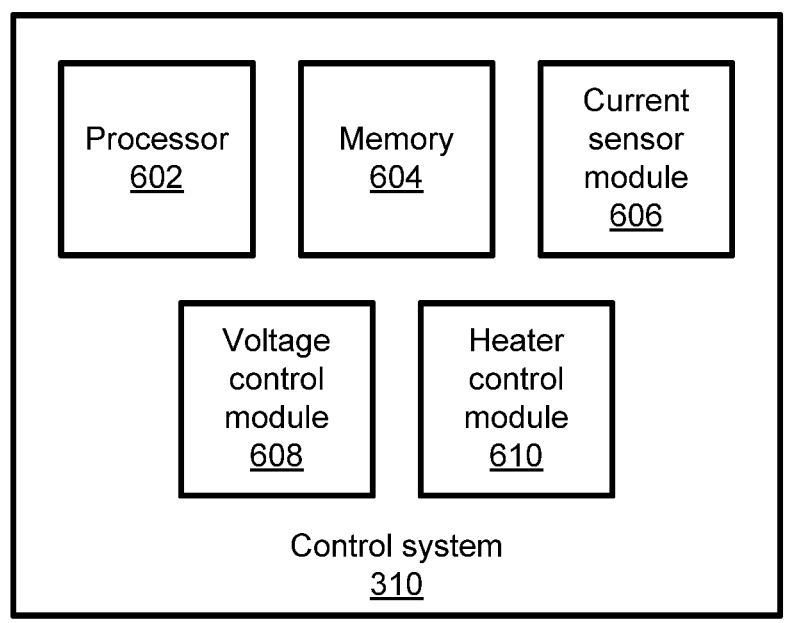
FIG. 6 is a block diagram of a control system for reducing stable dark current for a photodiode in accordance with the present principles.

Referring now to FIG. 6, detail on the control system 310 is shown. The control system 310 includes a hardware processor 602 and memory 604. In addition, the control system 310 includes multiple functional modules to perform certain roles in the system. In one embodiment, these modules may be implemented as software that is stored in memory 604 and executed on the hardware processor 602. In an alternative embodiment, the modules may be implemented as one or more special-purpose hardware components in the form of, for example, application specific integrated chips or field programmable gate arrays.

A current sensor module 606 interfaces with the dark current sensor 308 to determine the amount of dark current being generated by the photodiode 102. The current sensor module 606 therefore includes a physical interface to the dark current sensor 308 and, in one embodiment, may include the dark current sensor 308 itself. The current sensor module 606 stores dark current measurements in the memory 604.

A voltage control module 608 sets a voltage of the reverse bias voltage source 306. The voltage control module 608 therefore includes a physical interface to the reverse bias voltage source 306 and, in one embodiment, may include the reverse bias voltage source 306 itself. In addition, the voltage control module 608 accesses dark current measurements taken by the current sensor module 606 and correlates those measurements with respective voltage levels. Based on the correlation between dark current measurements and voltage levels, the voltage control module 608 may increase the voltage level of the reverse bias voltage source 306. Alternatively, the voltage control module 608 may use a constant voltage level. The voltage control module 608 also controls the amount of time that the reverse bias voltage source 306 operates. In one embodiment, the voltage control module 608 turns off the reverse bias voltage source 306 after ten hours.

A heater control module 610 interfaces with 304 to control the temperature of the photodiode 102. The heater control module 610 may maintain a constant temperature for an anneal or may, alternatively, vary the temperature over time. In one exemplary embodiment it is specifically contemplated that the heater control module 610 maintains a constant temperature of about 175° C. for up to about 20 hours.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
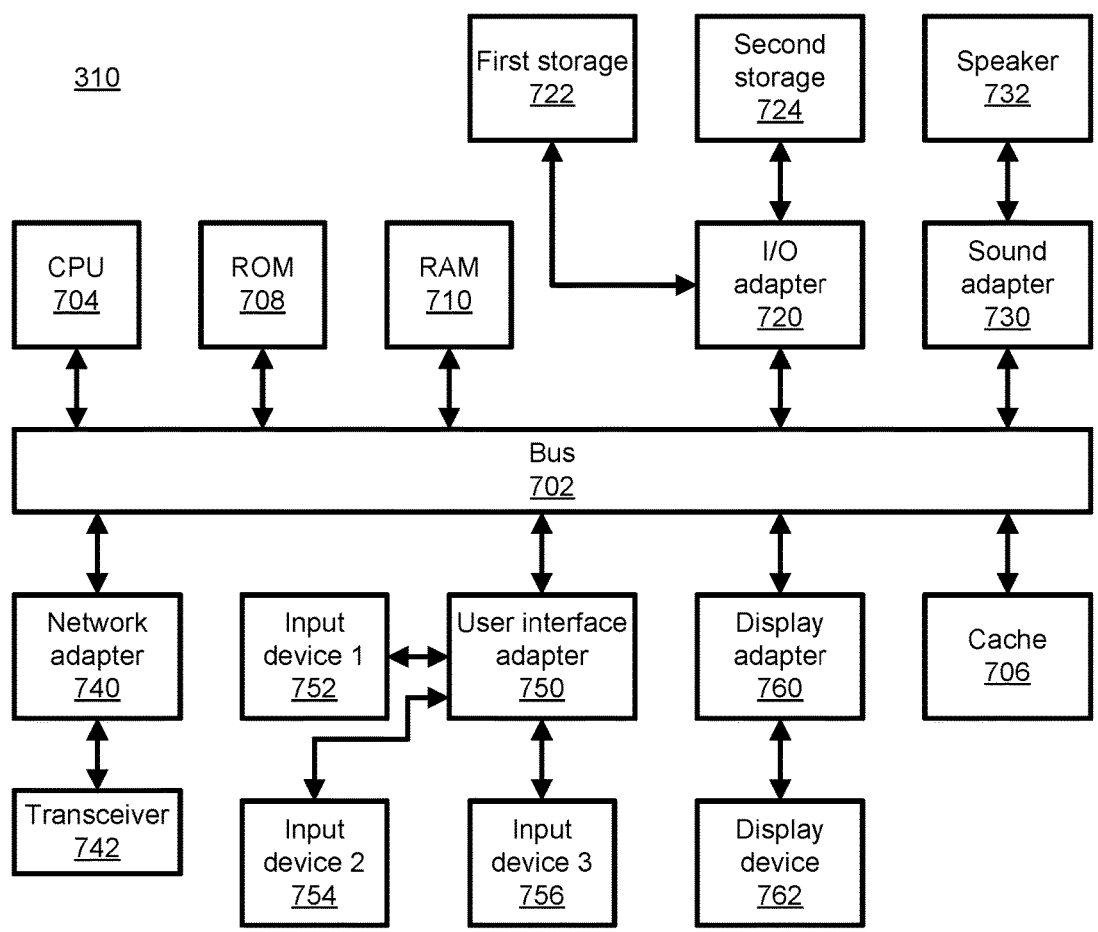
FIG. 7 is a block diagram of a control system for reducing stable dark current for a photodiode in accordance with the present principles.

Referring now to FIG. 7, an exemplary processing system 700 is shown which may represent the transmitting device 100 or the receiving device 120. The processing system 700 includes at least one processor (CPU) 704 operatively coupled to other components via a system bus 702. A cache 706, a Read Only Memory (ROM) 708, a Random Access Memory (RAM) 710, an input/output (I/O) adapter 720, a sound adapter 730, a network adapter 740, a user interface adapter 770, and a display adapter 760, are operatively coupled to the system bus 702.

A first storage device 722 and a second storage device 724 are operatively coupled to system bus 702 by the I/O adapter 720. The storage devices 722 and 724 can be any of a disk storage device (e.g., a magnetic or optical disk storage device), a solid state magnetic device, and so forth. The storage devices 722 and 724 can be the same type of storage device or different types of storage devices.

A speaker 732 is operatively coupled to system bus 702 by the sound adapter 730. A transceiver 742 is operatively coupled to system bus 702 by network adapter 740. A display device 762 is operatively coupled to system bus 702 by display adapter 760.

A first user input device 752, a second user input device 754, and a third user input device 756 are operatively coupled to system bus 702 by user interface adapter 750. The user input devices 752, 754, and 756 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 752, 754, and 756 can be the same type of user input device or different types of user input devices. The user input devices 752, 754, and 756 are used to input and output information to and from system 700.

Of course, the processing system 700 may also include other elements (not shown), as readily contemplated by one of skill in the art, as well as omit certain elements. For example, various other input devices and/or output devices can be included in processing system 700, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 700 are readily contemplated by one of ordinary skill in the art given the teachings of the present principles provided herein.

Having described preferred embodiments of reducing dark current in germanium photodiodes by electrical overstress (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for reducing dark current in a photodiode, comprising:
heating a photodiode above room temperature;
measuring the dark current generated by the photodiode; and
applying a reverse bias voltage to the heated photodiode to reduce a dark current generated by the photodiode, increasing the reverse bias voltage until the measured dark current stabilizes to maximize a stable dark current reduction after the photodiode returns to room temperature.

2. The method of claim 1, wherein heating the photodiode comprises heating the photodiode to about 175° C.

3. The method of claim 1, wherein the photodiode is formed from germanium above a silicon substrate.

4. The method of claim 1, wherein heating the photodiode comprises one of increasing an ambient temperature and applying an on-chip heater.

5. A computer readable storage medium comprising a computer readable program for reducing dark current in a photodiode, wherein the computer readable program when executed on a computer causes the computer to perform the steps of claim 1.

6. A method for reducing dark current in a photodiode, comprising:
heating a photodiode above room temperature; and
applying a reverse bias voltage to the heated photodiode to reduce a dark current generated by the photodiode, increasing the reverse bias volatage until reductions in dark current halt.

7. The method of claim 6, further comprising measuring the dark current generated by the photodiode.

8. The method of claim 7, further comprising increasing the reverse bias voltage until the measured dark current stabilizes to maximize a stable dark current reduction after the photodiode returns to room temperature.

9. The method of claim 6, wherein heating the photodiode comprises heating the photodiode to about 175° C.

10. The method of claim 6, wherein the photodiode is formed from germanium above a silicon substrate.

11. The method of claim 6, wherein heating the photodiode comprises one of increasing an ambient temperature and applying an on-chip heater.

12. A computer readable storage medium comprising a computer readable program for reducing dark current in a photodiode, wherein the computer readable program when executed on a computer causes the computer to perform the steps of claim 6.

* * * * *